(12) United States Patent
Kwon et al.

(10) Patent No.: US 11,747,393 B2
(45) Date of Patent: Sep. 5, 2023

(54) INTEGRATED CIRCUIT DEVICE, SEMICONDUCTOR SUBSTRATE, AND TEST SYSTEM INCLUDING THE INTEGRATED CIRCUIT DEVICE

(71) Applicant: SAMSUNG ELECTRONICS CO., LTD., Suwon-si (KR)

(72) Inventors: Daehyun Kwon, Hwaseong-si (KR); Donghee Kim, Seoul (KR); Sungoh Huh, Suwon-si (KR)

(73) Assignee: Samsung Electronics Co., Ltd.

( * ) Notice: Subject to any disclaimer, the term of this patent is extended or adjusted under 35 U.S.C. 154(b) by 0 days.

(21) Appl. No.: 17/703,535

(22) Filed: Mar. 24, 2022

(65) Prior Publication Data
US 2022/0317179 A1    Oct. 6, 2022

(30) Foreign Application Priority Data
Apr. 1, 2021 (KR) .................. 10-2021-0042815

(51) Int. Cl.
*G01R 31/28* (2006.01)
*H01L 23/48* (2006.01)
(Continued)

(52) U.S. Cl.
CPC ........ *G01R 31/2884* (2013.01); *H01L 23/481* (2013.01); *H01L 23/5227* (2013.01); *H01L 25/0655* (2013.01)

(58) Field of Classification Search
CPC ............ G01R 31/2884; G01R 31/2856; G01R 31/31924; G01R 31/2853; H01L 23/481;
(Continued)

(56) References Cited

U.S. PATENT DOCUMENTS 5,570,034 A    10/1996    Needham et al.
6,469,538 B1   11/2002    Gutpa
(Continued)

FOREIGN PATENT DOCUMENTS

CN    109856441 A    6/2019
JP      5216302 B2    6/2013

OTHER PUBLICATIONS

Mohammad Hamedsamimi, et al., a Review on the Rogowski Coil Principles and Applications, IEEE Sensors Journal, 651.
(Continued)

*Primary Examiner* — Giovanni Astacio-Oquendo
(74) *Attorney, Agent, or Firm* — Fish & Richardson P.C.

(57) ABSTRACT

An integrated circuit device, a semiconductor substrate, and a test system including the integrated circuit device are disclosed. The integrated circuit device includes a power terminal configured to receive a source voltage, a power via connected to the power terminal and passing through at least one of a number of layers, a number of inductive vias arranged apart from the power via and passing through at least one of the number of layers, a number of wirings connected to ends of at least some of the number of inductive vias and configured to form a coil wound in toroidal form together with the number of inductive vias, around the power via, and a test terminal configured to output an induced voltage in the coil externally of the integrated circuit device, in response to the supply of the source voltage.

20 Claims, 10 Drawing Sheets

(51) Int. Cl.
*H01L 23/522* (2006.01)
*H01L 25/065* (2023.01)

(58) Field of Classification Search
CPC . H01L 23/5227; H01L 25/0655; H01L 23/50; H01L 23/645; H01L 22/32; H01L 22/14; H01L 23/525
USPC .............. 324/762.03, 762.01, 537, 500
See application file for complete search history.

(56) References Cited

U.S. PATENT DOCUMENTS

| | | | |
|---|---|---|---|
| 7,864,021 B2 | 1/2011 | Matsushita et al. | |
| 8,310,225 B2 | 11/2012 | Michalak | |
| 10,041,978 B2 | 8/2018 | Salles et al. | |
| 2018/0156862 A1* | 6/2018 | Chen | G01R 31/2884 |
| 2019/0080971 A1* | 3/2019 | Hsu | H01L 22/34 |
| 2021/0239751 A1* | 8/2021 | Lin | G01R 31/2882 |

OTHER PUBLICATIONS

Muhammad Shafiq et al., Parameter Identification and Modeling of High-Frequency Current Transducer for Partial Discharge Measurements, IEEE Sensors Journal, vol. 13, No. 3, Nov. 15, 2012, 1081-1091, Finland.

Jingook Kim, IC Noise Source for Dynamic PDN Assessment, Designcon 2011, Jan. 2011.

* cited by examiner

INTEGRATED CIRCUIT DEVICE, SEMICONDUCTOR SUBSTRATE, AND TEST SYSTEM INCLUDING THE INTEGRATED CIRCUIT DEVICE

CROSS-REFERENCE TO RELATED APPLICATION

This application is based on and claims priority under 35 U.S.C. § 119 to Korean Patent Application No. 10-2021-0042815, filed on Apr. 1, 2021, in the Korean Intellectual Property Office, the subject matter of which is incorporated by reference.

BACKGROUND

The inventive concept relates to an integrated circuit device, and more particularly, to an integrated circuit device, a semiconductor substrate, and a test system for measuring a signal of the integrated circuit device or the semiconductor substrate.

As performance of electronic devices advance rapidly, a tests performed on semiconductor devices included in electronic devices are becoming more complex. To this end, equipment for testing semiconductor devices is growing in size. Improved technology for more accurately testing semiconductor devices, each including a number of integrated circuit devices is desired.

As an example of a test operation, current applied to semiconductor devices may be measured. In order to sense this current, in addition to semiconductor devices, separate devices may be required, or separate sensing elements may be installed in semiconductor devices. This test operation, becomes costly and time consuming, and as more and more separate elements are installed, measurements produce errors in their values.

SUMMARY

The inventive concept provides an integrated circuit device, a semiconductor substrate, and a test system including the integrated circuit device, which may measure a voltage and/or a current without a separate device, on the basis of electromagnetic induction.

According to an aspect of the inventive concept, there is provided an integrated circuit device including a number of layers, the integrated circuit device including a power terminal configured to accept a source voltage to be supplied, a power via connected to the power terminal and passing through at least one of the number of layers, a number of inductive vias arranged apart from the power via and passing through at least one of the number of layers, a number of wirings connected to ends of at least some of the number of inductive vias and configured to form a coil wound in a toroidal form together with the number of inductive vias, around the power via, and a test terminal configured to accept a voltage induced in the coil to be output to the outside of the integrated circuit device, in response to the supply of the source voltage to the power via.

According to another aspect of the inventive concept, there is provided
a semiconductor substrate including a number of redistribution wiring layers redistributing a number of pads of an integrated circuit device, the semiconductor substrate including a power terminal configured to accept a source voltage to be supplied, a power via connected to the power terminal and passing through at least one of the number of redistribution wiring layers, a number of inductive vias arranged apart from the power via and passing through at least one of the number of redistribution wiring layers, a number of wirings connected to ends of at least some of the number of inductive vias and configured to form a coil wound in a toroidal form together with the number of inductive vias, around the power via, and a test terminal configured to accept a voltage induced in the coil to be output externally of the semiconductor substrate, in response to the supply of the source voltage to the power via.

According to another aspect of the inventive concept, there is provided a test system including a test device and at least one integrated circuit device, the at least one integrated circuit device including a first integrated circuit device, wherein the first integrated circuit device includes a first terminal configured to receive a first voltage from the test device, a first via connected to the first terminal and passing through at least one of a number of layers, a number of second vias arranged apart from the first via and passing through at least one of the number of layers, a number of wirings connected to ends of at least some of the number of second vias and configured to form a coil wound in a toroidal form together with the number of second vias, around the first via, and a second terminal configured to accept a voltage induced in the coil to be output to the test device, in response to the supply of the first voltage to the first via, and the test device is connected to the second terminal and is configured to measure a signal supplied to the first integrated circuit device in response to the induced voltage.

BRIEF DESCRIPTION OF THE DRAWINGS

Embodiments of the inventive concept will be more clearly understood from the following detailed description taken in conjunction with the accompanying drawings in which.

DETAILED DESCRIPTION OF THE EMBODIMENTS

Hereinafter, embodiments will be described in detail with reference to the accompanying drawings.

Figure 1:
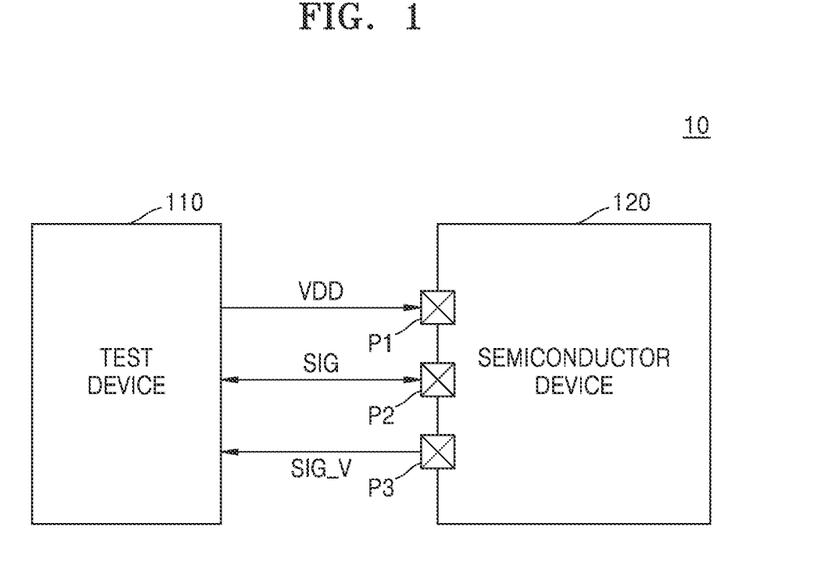
FIG. 1 is a block diagram illustrating a test system according to an embodiment.

FIG. 1 is a block diagram illustrating a test system 10 according to an embodiment.

Referring to FIG. 1, the test system 10 may include a test device 110 and a semiconductor device 120. The semiconductor device 120 may be a semiconductor package that includes a plurality of integrated circuit devices or a single integrated circuit device.

In an embodiment, the semiconductor device 120 may be implemented with a semiconductor package, and the semiconductor package may include a substrate and a number of integrated circuit devices mounted on the substrate. In an embodiment, when the semiconductor package is a memory device, the semiconductor package may include at least one core die including a memory cell array and a logic die.

For example, the semiconductor package may be implemented with package on package (PoP), chip scale package (CSP), die in waffle pack, die in wafer form, chip on board (COB), system in package (SIP), multi-chip package (MCP), wafer-level fabricated package (WFP), and wafer-level processed stack package (WSP), but is not limited thereto.

The semiconductor package may include a number of connection terminals that may be attached to a bottom surface of a substrate. Each of the connection terminals may include, for example, a solder ball or a bump. Each of the connection terminals may electrically connect the semiconductor package to an external device (i.e., the test device 110).

In an embodiment, the semiconductor device 120 may be implemented as an integrated circuit device and may be an integrated circuit device of a package type. That is, the integrated circuit device may include a number of connection terminals such as solder balls or a bumps. The integrated circuit device may be a semiconductor chip or a semiconductor die.

The integrated circuit device may include a memory semiconductor device or a logic semiconductor device. The logic semiconductor device may include, for example, a central processing unit (CPU), a graphics processing unit (GPU), a controller, an application specific integrated circuit (ASIC), or an application processor (AP). The memory semiconductor device may include, for example, dynamic random access memory (RAM) (DRAM), static random access memory (SRAM), flash memory, electrically erasable and programmable read-only memory (EEPROM), phase-change random access memory (PRAM), magnetic random access memory (MRAM), or resistive random access memory (RRAM).

The semiconductor device 120 may include a number of connection terminals, and the number of connection terminals may include a connection terminal which receives a source voltage VDD, a connection terminal which transfers and/or receives first and second signals SIG and SIG_V, and a do not use (DNU) connection terminal having no function assigned thereto or an unconnected connection terminal. The first signal SIG may include signals (for example, a clock signal, a command/address signal, and a data signal) associated with an operation of the semiconductor device 120, and the second signal SIG_V may include signals for measuring a variation of a voltage/current/frequency under various operating conditions of the semiconductor device.

A connection terminal supplied with the source voltage VDD may be designated as a power terminal P1, and a terminal for transferring or receiving the first signal SIG may be designated as a signal terminal P2. According to an embodiment, the second signal SIG_V generated by the semiconductor device 120 may be output to the test device 110 through a DNU terminal or an NC terminal, and such a connection terminal may be designated as a test terminal P3.

According to an embodiment, the test device 110 may supply the source voltage VDD to the semiconductor device 120 through the power terminal P1, and, as the source voltage VDD is supplied, the test device 110 may receive the second signal SIG_V, generated by the semiconductor device 120, through the test terminal P3. In an embodiment, the second signal SIG_V generated by the semiconductor device 120 may include an induced voltage, which is generated by the semiconductor device 120 on the basis of the source voltage VDD. The induced voltage would be an alternating current (AC) voltage.

The test device 110 may receive the source voltage VDD supplied to the semiconductor device 120 and the induced voltage of the received second signal SIG_V and may test the semiconductor device 120 in response to the received source voltage VDD and the induced voltage. In an embodiment, the test device 110 may continuously receive the second signal SIG_V and may determine the presence or lack thereof, of a defect in the semiconductor device 120 on the basis of the second signal SIG_V.

The test device 110 may process the second signal SIG_V received from the test terminal P3 of the semiconductor device 120 to generate a separate signal and may test the semiconductor device 120 in response to a separate signal. In an embodiment, the test device 110 may obtain the induced voltage of the second signal SIG_V from the semiconductor device 120 and may perform an integration of the induced voltage, to obtain a current signal (for example, SIG_I of FIG. 8). The test device 110 may predict a current supplied to the semiconductor device 120 on the basis of the current signal SIG_I and may monitor a current supplied to the semiconductor device 120.

A rogowski coil may be used for measuring the current supplied to the semiconductor device 120 and may be formed in the semiconductor device 120. A process of forming a rogowski coil in the semiconductor device 120 will be described below with reference to FIGS. 5 and 6.

According to an embodiment, a separate device (for example, a separate substrate) for measuring a current flowing in the semiconductor device 120 may not be needed, and thus, the cost incurred in a test operation may be reduced. Also, a current may be measured without adversely affecting the operation of the semiconductor device 120, and thus, measurement errors may decrease and the reliability of such measurements improve.

Also, according to an embodiment, an unused terminal among connection terminals included in the semiconductor device 120 may be used as the test terminal P3, and thus, a continuous current measurement value may be obtained, without a having a terminal with a separate test function.

Figure 2A:
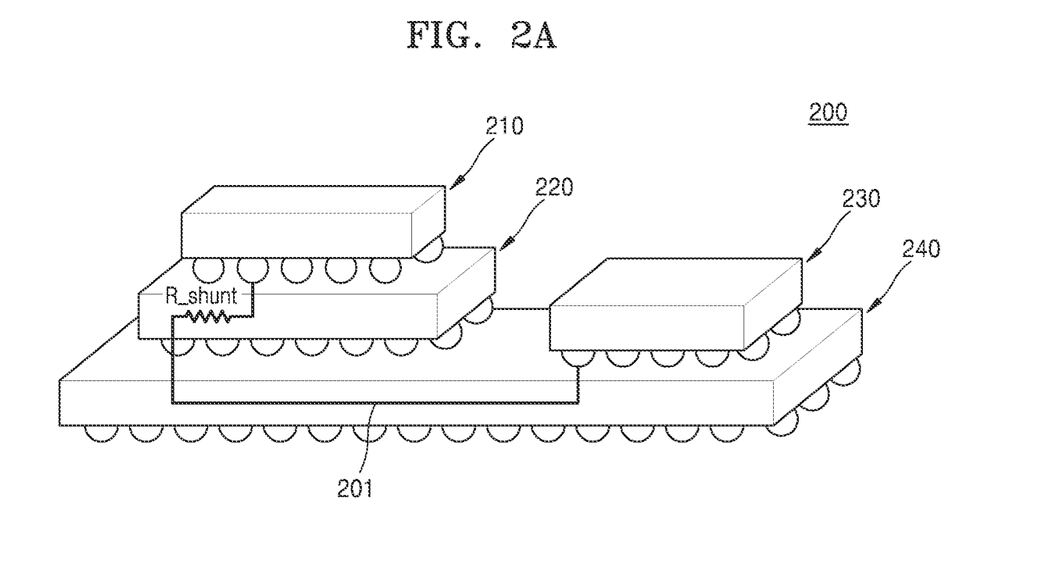
FIGS. 2A and 2B are diagrams schematically illustrating a signal measurement method according to a comparative example.
Figure 2B:
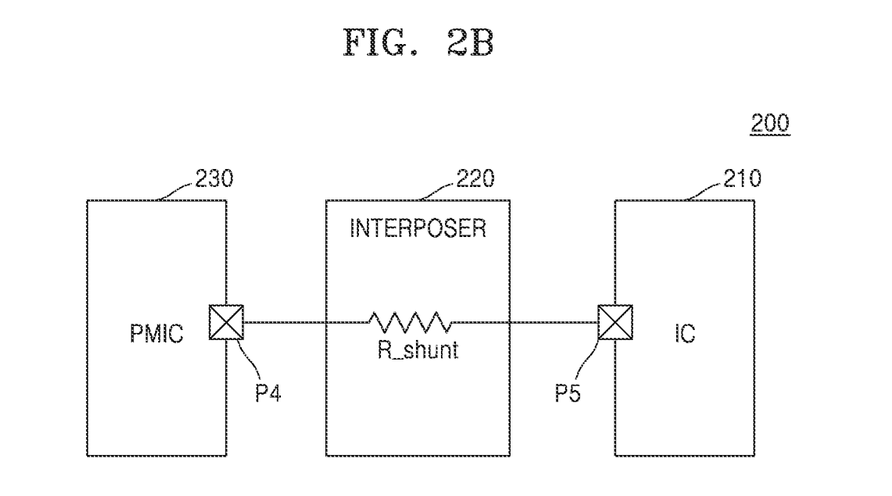

FIGS. 2A and 2B are diagrams schematically illustrating a signal measurement method according to a comparative example.

Referring to FIGS. 2A and 2B, a semiconductor device 200 may include a semiconductor chip 210, an interposer 220 with the semiconductor chip 210 mounted thereon, a printed circuit board (PCB) 240, and a power management integrated circuit (PMIC) 230, which supplies power to the semiconductor chip 210. The semiconductor device 200 may further include a number of other elements (not shown).

The PMIC 230 may supply power to the semiconductor chip 210 through a wiring 201 formed in the interposer 220 and the PCB 240. At this time, a test operation for measuring a current flowing in the semiconductor chip 210, in response to a supplied source voltage VDD may be performed.

According to the comparative example, a resistor R_shunt may be provided at a center portion of the wiring 201, and a current flowing in the resistor R_shunt may be measured based on a voltage applied to both ends of the resistor R_shunt, rendering a measurable current flowing in the semiconductor chip 210. In detail, the resistor R_shunt may be formed between a power terminal P4 of the PMIC 230 and a power terminal P5 of the semiconductor chip 210. In an embodiment, the resistor R_shunt may be implemented as a shunt resistor.

In this case, because the resistor R_shunt is provided at the center portion of the wiring 201, a voltage having a reduced level compared to a voltage supplied by the PMIC 230 may be supplied to the semiconductor chip 210, causing an unstable operation of the semiconductor device 200. Also, a measurement value due to a tolerance of the resistor R_shunt may produce an error.

Figure 3:
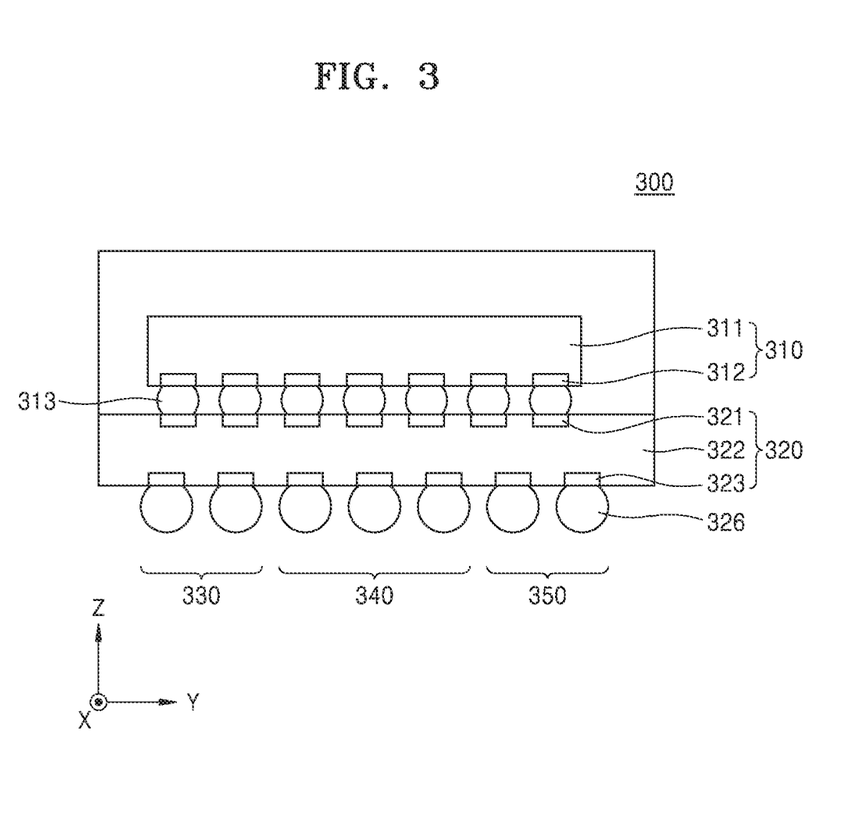
FIG. 3 is a cross-sectional view schematically illustrating an integrated circuit device according to an embodiment.

FIG. 3 is a cross-sectional view schematically illustrating an integrated circuit device 300 according to an embodiment. The integrated circuit device 300 of FIG. 3 may correspond to the semiconductor device 120 of FIG. 1.

Referring to FIG. 3, the integrated circuit device 300 may include a semiconductor die 310 and a substrate 320 with the semiconductor die 310 mounted thereon. FIG. 3 illustrates that the semiconductor die 310 is mounted as a flip-chip bonding type, but mount types are not limited thereto. Also, in FIG. 3, one semiconductor die 310 is illustrated as being mounted on the substrate 320, but a semiconductor die stack including a number of semiconductor dies 310 may be mounted on the substrate 320.

The semiconductor die 310 may include a chip body 311 and a lower pad 312, and may further include a via (not shown). The via may pass through the semiconductor die 310, and one end of the via may be connected to the lower pad 312. The via may be directly connected to the lower pad 312, or may be connected to the lower pad 312 through a wiring layer (not shown). A number of connection terminals 313 may be disposed under the semiconductor die 310 and may electrically connect the semiconductor die 310 to the substrate 320.

The substrate 320 may include a substrate body 322, a substrate upper pad 321 disposed on a top surface of the substrate body 322, and a substrate lower pad 323 disposed at the bottom surface of the substrate body 322. A wiring structure, which electrically connects the substrate upper pad 321 to the substrate lower pad 323, may be provided in the substrate body 322. The substrate lower pad 323 may contact a connection terminal 326 of the substrate 320. The connection terminal 326 of the substrate 320 may be electrically connected to the connection terminal 313 of the semiconductor die 310 through the substrate lower pad 323, an internal wiring structure, and the substrate upper pad 321. In an embodiment, the connection terminal 326 may include a solder bump and may electrically connect the integrated circuit device 300 to an external device (not shown).

The substrate 320 may include a power terminal 350, which is supplied with power from an external PMIC (not shown), a signal terminal 340, which transfers or receives a signal SIG, and a DNU terminal 330, which is undesignated. The power terminal 350 may include a terminal connected to a source voltage VDD and a terminal connected to a ground node.

According to an embodiment, the substrate 320 may use at least one of the DNU terminals 330 as a test terminal, and thus, a current flowing in the integrated circuit device 300 may be measured without a separate device. When power is supplied to the integrated circuit device 300 through the power terminal 350, an induced voltage may occur in a number of vias and a number of wirings, which are arranged in a certain form on the semiconductor die 310 and/or the substrate 320. A form, where the number of vias and the number of wirings are arranged, will be described below with reference to FIGS. 4 to 7.

In an embodiment, the number of vias and the number of wirings may be connected to an external test device, for example, the test device 110, through a test terminal to form a closed circuit. In this case, the test terminal may be configured with at least two connection terminals 326. When the induced voltage is output to the exterior of the integrated circuit device 300 through the test terminal, the test device 110 may measure a voltage and/or a current supplied to the integrated circuit device 300 in response to the induced voltage. Also, a continuous measurement value may be obtained.

Figure 4:
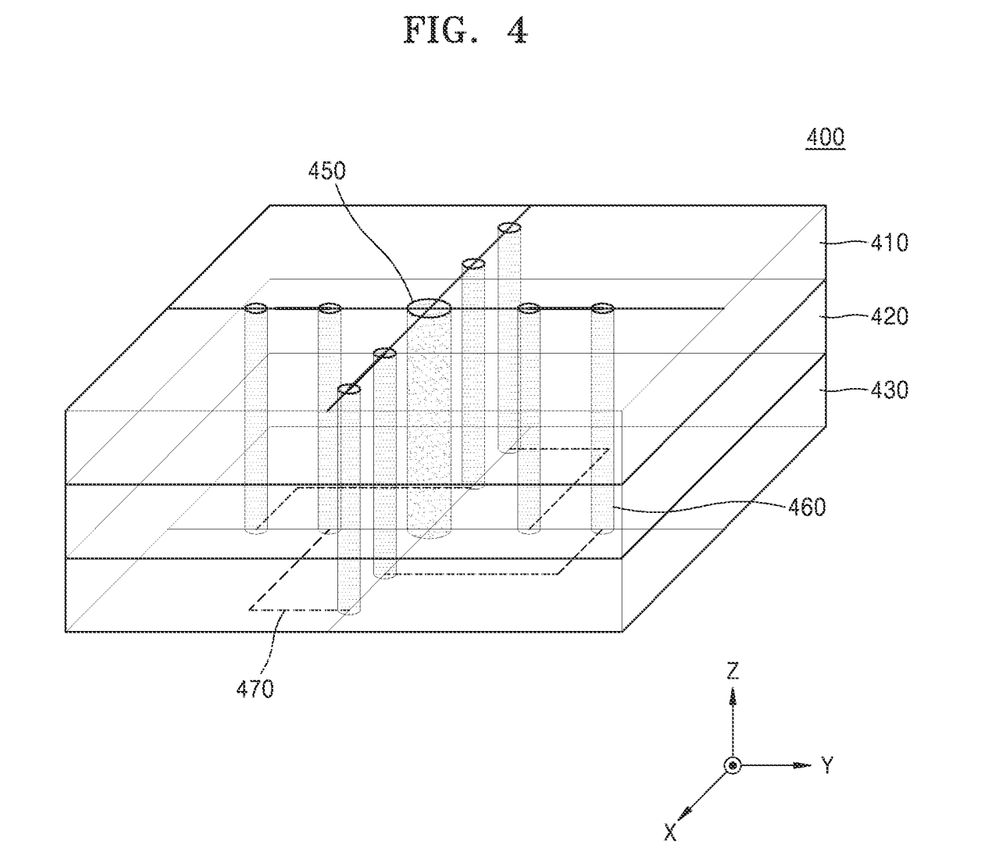
FIG. 4 is a perspective view schematically illustrating an integrated circuit device according to an embodiment.

FIG. 4 is a perspective view schematically illustrating an integrated circuit device according to an embodiment. The perspective view of FIG. 4 schematically illustrates a portion of the semiconductor die 310 or the substrate 320 of the integrated circuit device 300 of FIG. 3. Hereinafter, for example, a semiconductor die 400 according to an embodiment will be described, but the inventive concept is not limited thereto.

The semiconductor die 400 may include a number of layers 410 to 430 having a stack structure, and also include a number of vias 450 and 460 passing through at least some of the number layers (for example, first to third layers) 410 to 430. A through silicon via (TSV) may form an electrode vertically passing through silicon which is a semiconductor substrate material and may provide a signal transfer path. For example, one end of each of the vias 450 and 460 may be connected to a pad formed in the first layer 410, and the other end thereof may be connected to a pad formed in the third layer 430.

A via, which is connected to a power terminal P1 and transfers a source voltage VDD, may be designated as a power via 450, and a via, which is connected to a signal terminal P2 and transfers control and/or data signals SIG, may be designated as a signal via. According to an embodiment, as current flows in the power via 450, an induced voltage is generated in a number of vias, and at this time, vias where the induced voltage occurs may each be designated as inductive vias 460.

In order for the induced voltage to occur in the inductive vias 460, a closed circuit including the inductive vias 460 is formed. The closed circuit may include a number of inductive vias 460 and wiring 470 connecting the number of inductive vias 460. According to an embodiment, as in FIG. 4, the inductive vias 460 and a plurality of wirings 470 may be provided for generating the induced voltage. Therefore, the induced voltage may occur in the semiconductor die 400. The inductive vias 460 and the wiring 470 may be provided to configure a closed circuit so that the induced voltage is generated based on the supply of the source voltage VDD, and thus, the arrangement of the inductive vias 460 and the wiring 470 is not limited to the illustration of FIG. 4.

In an embodiment, a number of inductive vias 460 and a number of wirings 470 may be arranged so that a coil wound in a toroidal form is realized around the power via 450. For example, the number of inductive vias 460 and the number of wirings 470 may be arranged to form a rogowski coil, which includes the power via 450 as an air core. For example, at least eight inductive vias may be provided, and four of the eight inductive vias may be arranged apart from the power via 450 by a certain distance in a cross configuration. The four inductive vias may be respectively disposed in an eastern direction, a western direction, a southern direction, and a northern direction with respect to the power via 450. Therefore, four inductive vias close to the power via 450 may form a small tetragonal shape, and four inductive vias far away from the power via 450 may form a larger tetragonal shape When a coil is wound, an inductive via forming first end of a coil and an inductive via forming a second end of a coil may be configured. One end of each of two inductive vias may be connected to a corresponding test terminal. The test terminals may be connected to a test device (for example, 110 of FIG. 1) external of the integrated circuit device to form a coil in a closed circuit.

When the source voltage VDD is applied to the power via 450 disposed at a coil center, a variation of a current may occur in the power via 450, and thus, a voltage may be induced in a coil formed near the power via 450. A current flowing in the power via 450 may be predicted based on the induced voltage. The induced voltage may be output, through a test terminal connected to the inductive via 460, and in this case, the test terminal may be connected to the test device 110, whereby the test device 110 may continuously measure a current flowing in the semiconductor die 400 without a separate device.

Figure 5:
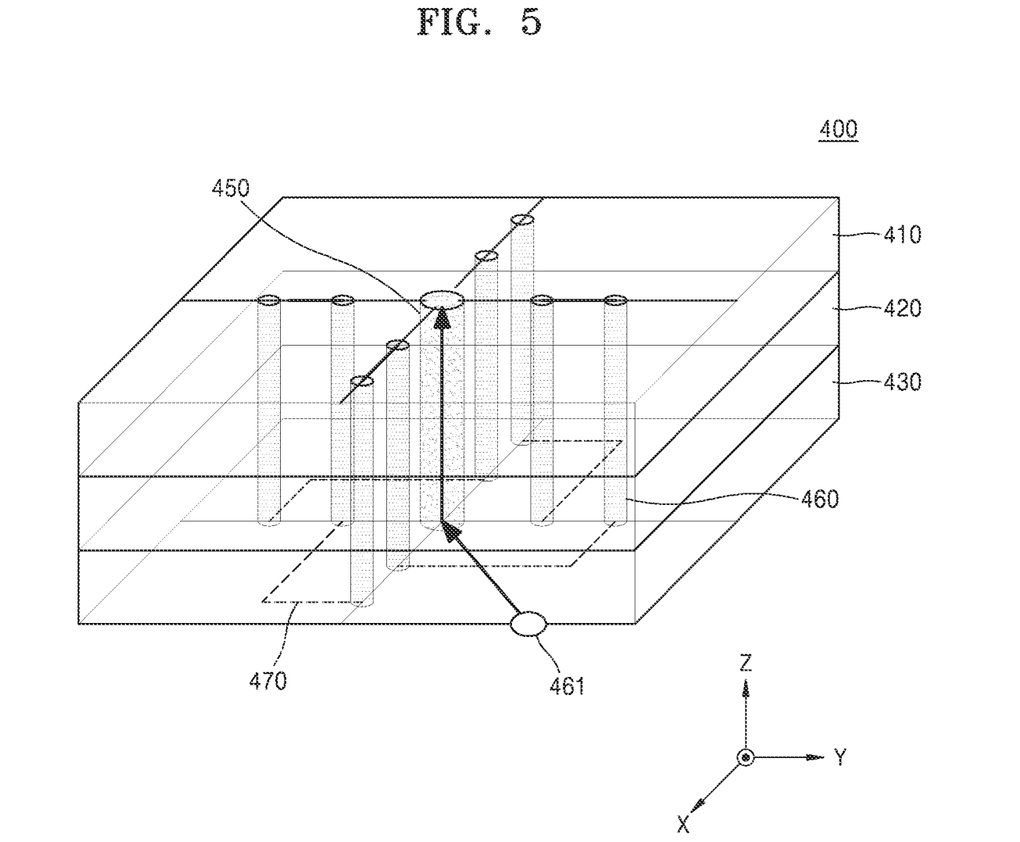
FIGS. 5 and 6 are perspective views schematically illustrating a process of forming a coil in an integrated circuit device according to an embodiment.
Figure 6:
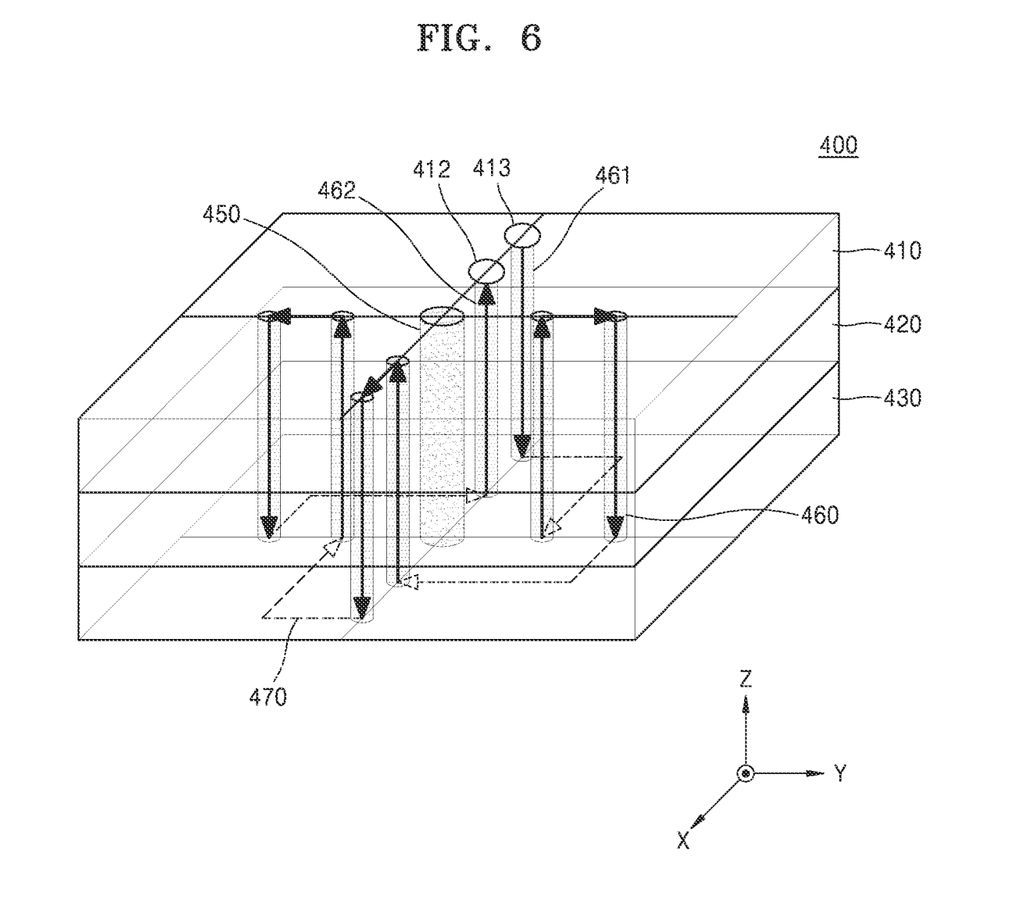

FIGS. 5 and 6 are perspective views schematically illustrating a process of forming a coil in an integrated circuit device according to an embodiment. The perspective views of FIGS. 5 and 6 schematically illustrate a portion of the semiconductor die 310 or the substrate 320 of the integrated circuit device 300 of FIG. 3. Hereinafter, by way of example, a semiconductor die 400 according to an embodiment will be described, but the inventive concept is not limited thereto.

Referring to FIG. 5, as a voltage is supplied to a power via 450 through a power terminal 461, a current flowing in the power via 450 may be generated. In FIG. 5, it is shown that a current flows in a direction from a third layer 430 to a first layer 410, but a direction of the current may be a direction opposite thereto.

Referring to FIG. 6, when a current flows in the power via 450, an induced voltage may be generated by a coil formed by a number of inductive vias 460 and a number of wirings 470. Each of the number of wirings 470 may be formed to connect ends of two inductive vias and may be formed on a layer where the ends of the two inductive vias are formed. Moreover, the ends of the two inductive vias may be respectively formed on different layers, and in this case, ends of two inductive vias may be connected to each other through a number of wirings and a separate via.

For example, one end 413 of a first inductive via 461 may form first end of a coil, and one end 412 of a second inductive via 462 may form a second end of the coil. The inductive via 460 forming two ends of a coil is not limited thereto. Two different inductive vias 460 may be connected to each other by a wiring 470, and thus, a coil winding about the periphery of the power via 450 in a donut form may be realized. In an embodiment, a coil may be formed where four inductive vias close to the power via 450 are wound in a +Z-axis direction and four inductive vias at a distance away from the power via 450 are wound in a −Z-axis direction.

A winding direction is not limited to a certain direction, and a coil may be formed where four inductive vias close to the power via 450 are wound in the −Z-axis direction and four inductive vias at a distance away from the power via 450 are inwardly wound in the +Z-axis direction.

Each of the one end 413 of the first inductive via 461 and the one end 412 of the second inductive via 462 may be connected to a test terminal (not shown), and the test terminal may be connected to an external test device (for example, 110 of FIG. 1), whereby a coil may form a closed circuit. A direction in which a coil is wound and/or a start and an end of the coil are/is not limited by the exemplary descriptions given thereto.

Figure 7:
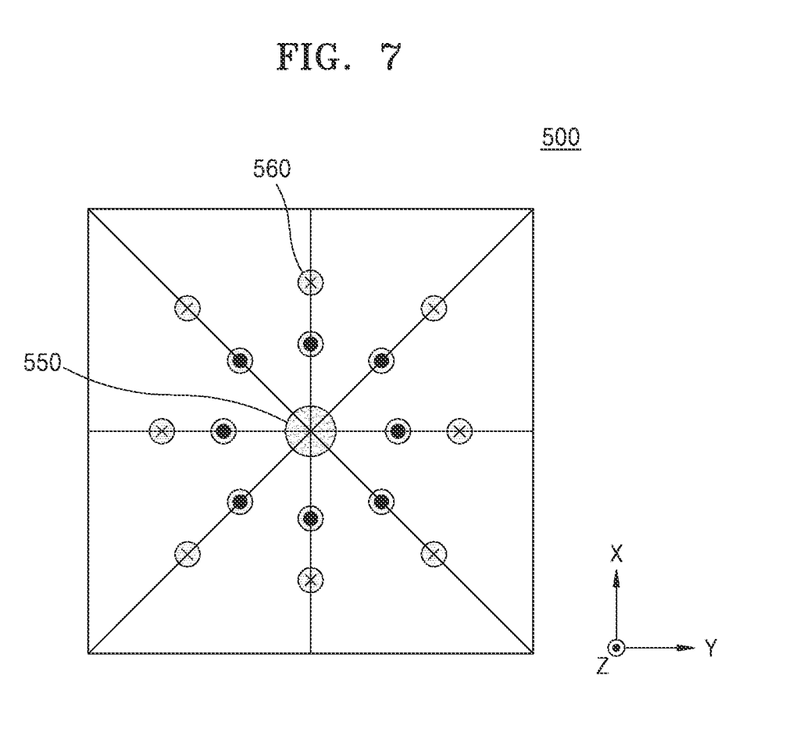
FIG. 7 is a plan view schematically illustrating an integrated circuit device according to an embodiment.

FIG. 7 is a plan view schematically illustrating an integrated circuit device according to an embodiment. The plan view of FIG. 7 schematically illustrates the semiconductor die 310 or the substrate 320 of the integrated circuit device 300 of FIG. 3. Hereinafter, for example, a semiconductor die 500 according to an embodiment will be described, but the inventive concept is not limited thereto. Also, descriptions which are the same as, or similar to the above descriptions are omitted as redundant.

Referring to FIG. 7, the semiconductor die 500 may include sixteen inductive vias 560. The sixteen inductive vias 560 may be arranged in eight different directions. For example, two inductive vias may be arranged in each of an eastern direction, a southeastern direction, a southern direction, a southwestern direction, a western direction, a northern direction, and a northeastern direction. Therefore, eight vias close to a power via 550 may form a small octagonal shape, and eight vias at a further distance away from the power via 550 may form a larger octagonal shape. A coil formed through the arrangement of FIG. 7 may be more compact than a coil formed as illustrated in FIGS. 4 to 6. A test terminal may be connected to one end of each of two inductive vias 560 of the sixteen inductive vias 560, and thus, an induced voltage generated by a coil may be provided externally of the semiconductor die 500.

In FIG. 7, conventional symbols show the +Z-axis direction, −Z-axis direction. Therefore, according to the embodiment of FIG. 7, a coil may be formed where eight inductive vias close to the power via 550 are wound in a +Z-axis direction and eight inductive vias at a distance away from the power via 550 are wound in a −Z-axis direction. One end of one inductive via of inductive vias forming a coil in the +Z-axis direction and one end of one inductive via of inductive vias forming a coil in the −Z-axis direction may respectively form the two ends of a coil. A direction in which a coil is wound and/or a start and an end of the coil are/is not limited by the exemplary description given hereto.

Also, the number of inductive vias 560 for forming a coil is not limited thereto. An inductive via may be further disposed in a direction between two adjacent directions of eight directions, and in this case, a coil which is more compact than FIG. 7 may be realized.

Figure 8:
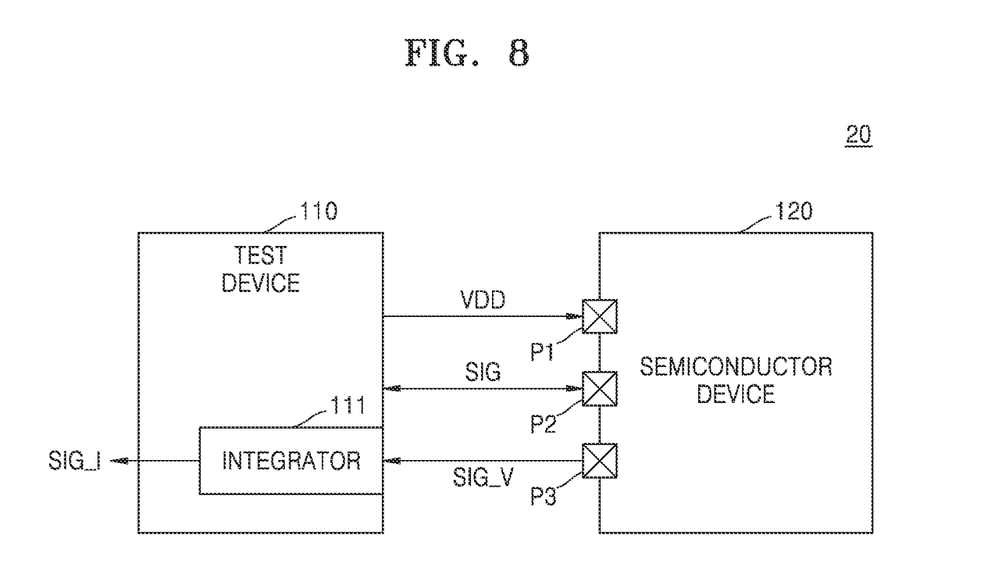
FIG. 8 is a block diagram illustrating a test system according to an embodiment.
Figure 9:
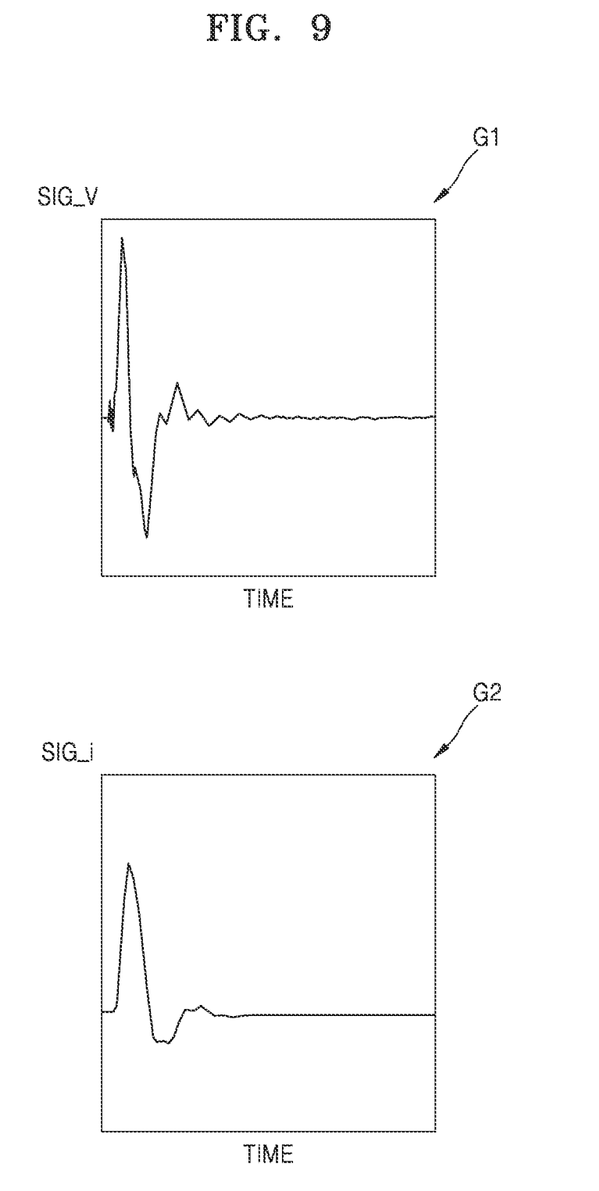
FIG. 9 is a graph showing signals according to an embodiment.

FIG. 8 is a block diagram illustrating a test system 20 according to an embodiment, and FIG. 9 is a graph showing signals according to an embodiment. The test system 20 of FIG. 8 may be an embodiment of the test system 10 of FIG. 1. Hereinafter, therefore, description which is the same as or similar to the description of FIG. 1 is omitted as redundant.

Referring to FIGS. 8 and 9, a test device 110 may receive a second signal SIG_V (for example, an induced voltage from a coil formed in a semiconductor device 120) which is output from the semiconductor device 120 through a test terminal P3. A graph of the second signal SIG_V with respect to time is shown as G1.

The test device 110 may include an integrator 111, and the integrator 111 may be implemented as various types of circuits. The integrator 111 performs an integration on the second signal SIG_V continuously received over time to generate a current signal SIG_I. A graph of the current signal SIG_I with respect to time is shown as G2.

The test device 110 may perform a test operation on the semiconductor device 120 in response to the second signal SIG_V output from the test terminal P3 and/or the current signal SIG_I generated by the integrator 111. The integrator 111 may be provided externally of the test device 110, and for example, may be provided in the semiconductor device 120. In this case, a signal output from the test terminal P3 may be the current signal SIG_I instead of a voltage signal of the second signal SIG_V.

Figure 10:
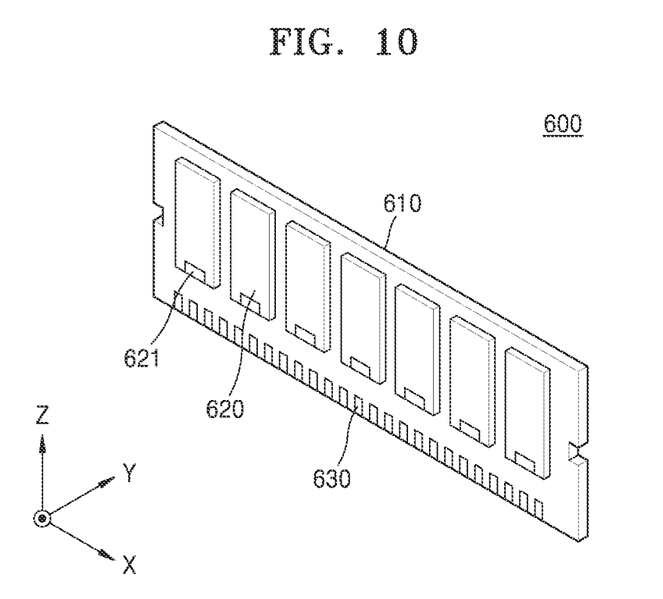
FIG. 10 is a perspective view of a semiconductor module according to an embodiment.

FIG. 10 is a perspective view of a semiconductor module 600 according to an embodiment.

Referring to FIG. 10, the semiconductor module 600 may include a PCB 610, a number of semiconductor packages 620, and a number of external connection terminals 630.

The semiconductor packages 620 may correspond to the semiconductor device (for example, 120 of FIG. 1) described above. Therefore, each of the semiconductor packages 620 may be supplied with a source voltage VDD through a power terminal of the external connection terminals 630 and may output an induced voltage through an internal test terminal 621 and an external test terminal.

In an embodiment, the semiconductor module 600 may include a memory module. For example, the semiconductor module 600 may include a dual inline memory module (DIMM), a small outline DIMM (SO-DIMM), an unbuffered-DIMM, or a fully buffered DIMM (FB-DIMM).

The PCB 610 may be a substrate on which the number of semiconductor packages 620 are mounted. The PCB 610 may include a PCB card, a plastic substrate, or a semiconductor substrate having a different structure. The PCB 610 may have a structure where a number of metal wiring layers and a number of insulation layers are alternately stacked.

The semiconductor packages 620 may include a non-volatile memory device. In an embodiment, the semiconductor packages 620 may include a NAND-type flash memory. In an embodiment, the semiconductor packages 620 may include PRAM, MRAM, ReRAM, FRAM, or NOR flash memory. In an embodiment, the semiconductor packages 620 may include a volatile memory device such as DRAM or SRAM.

The number of external connection terminals 630 may be arranged in one row under the PCB 610 in a lengthwise direction (i.e., an X direction) of the PCB 610. The external connection terminals 630 may include a ground terminal, a power terminal, and a signal terminal. The signal terminal may include an address terminal through which an address signal is input, a command terminal through which a command signal is input, a clock terminal through which a clock signal is input, and a data terminal through which data is input or output. In an embodiment, the external connection terminals 630 may be implemented as a pad, a pin, or a tab.

Also, the external connection terminals 630 may include a terminal (or a DNU terminal), where an input or output signal SIG is not designated, of the external connection terminals 630. At least two of a number of DNU terminals may be used as external test terminals.

According to an embodiment, the internal test terminal 621 formed in each of the semiconductor packages 620 may be connected to an external test terminal formed in the PCB 610. Therefore, without the use of separate device such as an interposer, a current signal SIG_I flowing in each of the number of semiconductor packages 620 may be determined and measured outside the semiconductor module 600.

Figure 11:
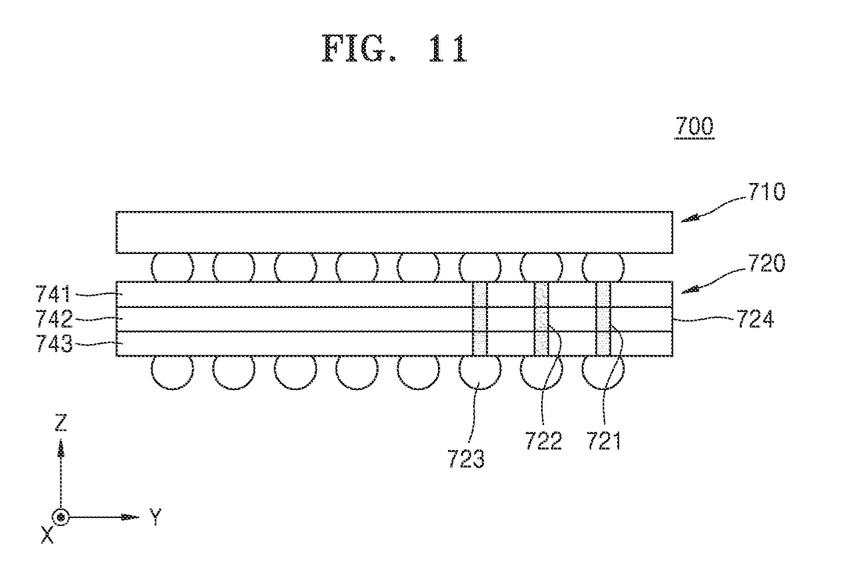
FIG. 11 is a cross-sectional view of a semiconductor package according to an embodiment.

FIG. 11 is a cross-sectional view of a semiconductor package 700 according to an embodiment.

Referring to FIG. 11, the semiconductor package 700 may include an integrated circuit device 710 and an interposer 720. The integrated circuit device 710 may correspond to the integrated circuit device (for example, 300 of FIG. 3) described above, and thus, a repeated description is omitted as redundant. The interposer 720 may redistribute a pad of the integrated circuit device 710.

The interposer 720 may include a base substrate 724, a wiring (not shown), a number of vias 721 and 722, and a connection terminal. The base substrate 724 may include a silicon wafer. The wiring may be formed on a top surface of the base substrate 724, and for example, may have a back-end-of-line (BEOL) structure. The vias 721 and 722 may extend from the top surface of the base substrate 724 to a bottom surface thereof, and may pass through the base substrate 724. The interposer 720 may be connected to an external substrate (for example, a PCB) through a connection terminal 723. Like the above description, the connection terminal 723 of the interposer 720 may include a power terminal, a signal terminal, and a DNU terminal, and some of a number of DNU terminals that may be used as test terminals.

The integrated circuit device 710 may be electrically connected to an external substrate through the interposer 720. That is, power supplied from an external PMIC may be supplied to the integrated circuit device 710 through the interposer 720. The interposer 720 may include a number of redistribution wiring layers 741 to 743 in the base substrate 724. In this case, the redistribution wiring layers 741 to 743 of the interposer 720 may correspond to the number of layers 410 to 430 described above with reference to FIGS. 4 to 7.

A via connected to a power terminal of the interposer 720 may be designated as a power via 722, and a number of vias disposed to form a coil around the power via 722 may be designated as inductive vias 721. The arrangement of the inductive vias 721 formed in the interposer 720 may be similar to descriptions given above with reference to FIGS. 4 to 7. In FIG. 11, one power via 722 and two inductive vias 721 are illustrated, but the number of power vias 722 and inductive vias 721 are merely an example and are not limited thereto.

A number of inductive vias 721 may form a coil around the power via 722, and a voltage induced in a coil may be output to the outside through a test terminal. A test terminal of the interposer 720 may be directly connected to the external test device, for example, the test device 110, may be connected to the test device 110 through a separate PCB. In the case where the test terminal of the interposer 720 is connected to the test device 110 through the PCB, a test terminal may be provided in the PCB, and thus, an induced voltage may be output through the test terminal.

Figure 12:
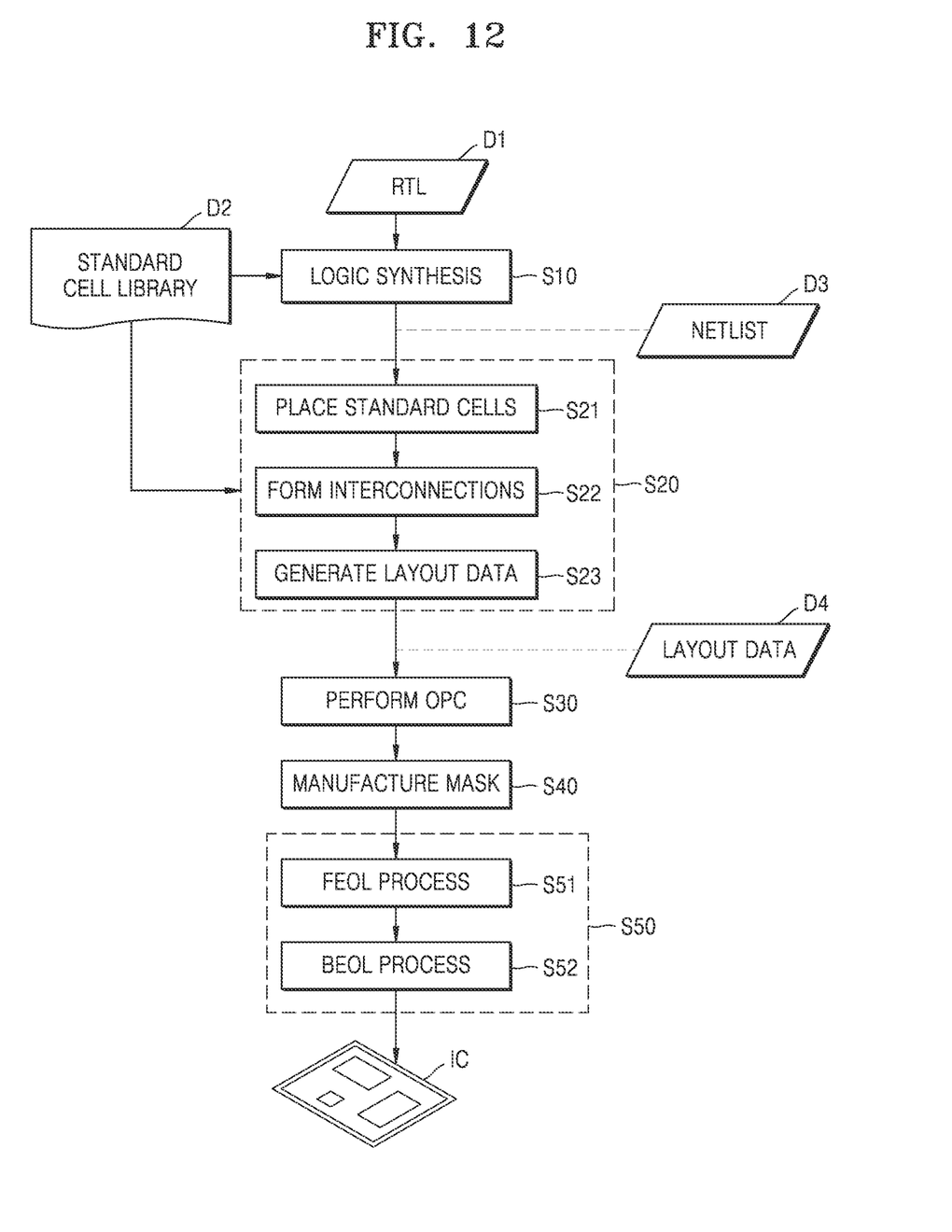
FIG. 12 is a flowchart illustrating a method of manufacturing an integrated circuit device, according to an embodiment.

FIG. 12 is a flowchart illustrating a method of manufacturing an integrated circuit device, according to an embodiment. In detail, the flowchart of FIG. 12 illustrates a method of manufacturing an integrated circuit device (for example, 300 of FIG. 3) described above.

The integrated circuit device may include a number of various standard cells, and each of the standard cells provides a unique function. The standard cells may have a structure conforming to rules which are designated based on a semiconductor process of manufacturing the integrated circuit device, and for example, may have a certain length or a multiple of a certain length in a certain direction, on a plane vertical to a stack direction of layers.

A standard cell library (or a cell library) D2 may include information about standard cells, and for example, may include function information, characteristic information, and layout information and may include arrangement information about a power via and an inductive via with respect to the power via.

In operation S10, a logic synthesis operation of generating a netlist D3 from resistor transistor logic (RTL) data D1 may be performed. For example, a semiconductor design tool (for example, a logic synthesis tool) may perform a logic synthesis operation on the basis of the standard cell library D2 from the RTL data D1 written in a hardware description language (HDL) such as VERILOG and a hardware description language (VHDL), thereby generating a netlist D3 including a netlist or bitstream. The standard cell library D2 may include information about the placement of vias, and standard cells may be added to the integrated circuit device on the basis of the information in a logic synthesis process.

In operation S20, a place and routing (P&R) operation of generating layout data D4 from the netlist D3 may be performed. As illustrated in FIG. 11, a P&R operation (S20) may include a number of operations (S21 to S23). In operation S21, an operation of placing the standard cells may be performed. For example, a semiconductor design tool (for example, a P&R tool) may place a number of standard cells on the basis of the standard cell library D2 from the netlist D3. For example, the semiconductor design cell may place a layout defined by the netlist D3 on the basis of the standard cell library D2. In operation S22, an operation of generating interconnections may be performed. Each of the interconnections may electrically connect an output pin to an input pin, and for example, may include at least one via and at least one conductive pattern. In operation S23, an operation of generating layout data D4 may be performed. The layout data D4 may have, for example, a format such as graphics design system-II (GDSII) and may include geometrical information about the interconnections and the standard cells.

In operation S30, optical proximity correction (OPC) may be performed. The OPC may correct distortion such as refraction caused by a characteristic of light in photolithography included in a semiconductor process of manufacturing the integrated circuit design, and thus, may denote an operation of forming a pattern having a desired shape. Also, a pattern on mask may be determined by applying the OPC to the layout data D4. In some embodiments, a layout of the integrated circuit device may be limitedly modified in operation S30, and an operation of restrictively modifying the integrated circuit device in operation S30 may be post-processing for optimizing a structure of the integrated circuit device and may be referred to as design polishing.

In operation S40, an operation of manufacturing a mask may be performed. For example, by applying the OPC to the layout data D4, patterns on the mask may be defined for forming patterns formed in a number of layers, and at least one mask (or photomask) for forming the patterns of the number of layers that may be manufactured.

In operation S50, an operation of manufacturing the integrated circuit device may be performed. For example, a number of layers may be patterned by using at least one mask which is manufactured in operation S40, and thus, the integrated circuit device may be manufactured. As illustrated in FIG. 11, operation S50 may include operations S51 and S52. In operation S51, a front-end-of-line (FEOL) process may be performed. The FEOL process may denote a process of forming individual elements (for example, a transistor, a capacitor, a resistor, etc.) on a substrate in a process of manufacturing the integrated circuit device. For example, the FEOL process may include an operation of planarizing and cleaning a wafer, an operation of forming a trench, an operation of forming a well, an operation of forming a gate line, and an operation of forming a source and a drain. In operation S52, a BEOL process may be performed. The BEOL process may denote a process of interconnecting the individual elements (for example, a transistor, a capacitor, a resistor, etc.) on a substrate in the process of manufacturing the integrated circuit device. For example, the BEOL process may include an operation of silicidating a gate region, a source region, and a drain region, an operation of adding a dielectric, a planarization operation, an operation of forming a hole, an operation of adding a metal layer, an operation of forming a power via and an inductive via, and an operation of forming a passivation layer. Subsequently, the integrated circuit device may be packaged in a semiconductor package and may be used as a part of each of various applications.

The integrated circuit device manufactured through the operations described above may include a coil for generating an induced voltage, and thus, may measure the second signal SIG_V through a test terminal without a separate device for sensing the second signal SIG_V. Accordingly, accurate measurement values may be obtained, and the performance of a test operation may be enhanced.

While the inventive concept has been particularly shown and described with reference to embodiments thereof, it will be understood that various changes in form and details may be made therein, without departing from the spirit and scope of the following claims.

What is claimed is:

1. An integrated circuit device including a plurality of layers, the integrated circuit device comprising:
   a power terminal configured to accept a source voltage to be supplied;
   a power via connected to the power terminal passing through at least one of the plurality of layers;
   a plurality of inductive vias disposed about said power via and passing through at least one of said plurality of layers;
   a plurality of wirings connected to ends of at least some of said plurality of inductive vias and configured to form with said inductive vias a coil wound in a toroidal form around said power via; and
   a plurality of test terminals, each configured accept a voltage induced in said coil to be output externally of the integrated circuit device, in response to the supply of the source voltage to the power via.

2. The integrated circuit device of claim 1, wherein one end of a first inductive via forms an end of said coil and is connected to a first test terminal,
   one end of a second inductive via forms another end of said coil and is connected to a second test terminal, and
   the first and second test terminals are connected to a measurement device.

3. The integrated circuit device of claim 2, wherein the measurement device is configured to perform an integration of the induced voltage to calculate a current supplied to the integrated circuit device.

4. The integrated circuit device of claim 1, wherein the plurality of inductive vias comprise at least four inductive vias, and the at least four inductive vias are arranged apart from one another in four different directions around said power via.

5. The integrated circuit device of claim 4, wherein the four inductive vias are each disposed at the same distance from said power via.

6. The integrated circuit device of claim 4, wherein the plurality of inductive vias comprise at least four inductive vias, and at least eight additional inductive vias disposed apart from one another in eight different directions with respect to said power via.

7. The integrated circuit device of claim 1, wherein the test terminal comprises a do not use (DNU) terminal of a plurality of connection terminals formed in the integrated circuit device.

8. The integrated circuit device of claim 1, wherein the integrated circuit device comprises a memory device.

9. The integrated circuit device of claim 8, wherein the integrated circuit device is mounted on a memory module.

10. A semiconductor substrate including a plurality of redistribution wiring layers redistributing a plurality of pads of an integrated circuit device, the semiconductor substrate comprising:
   a power terminal configured to accept a source voltage to be supplied;
   a power via connected to the power terminal and passing through at least one of the plurality of redistribution wiring layers;
   a plurality of inductive vias disposed about said power via and passing through at least one of the plurality of said redistribution wiring layers;
   a plurality of wirings connected to ends of at least some of the plurality of inductive vias and configured to form with said inductive vias a coil wound in a toroidal form, around said power via; and
   a plurality of test terminals, each configured to accept a voltage induced in said coil to be output externally of the semiconductor substrate, in response to the supply of the source voltage to said power via.

11. The semiconductor substrate of claim 10, wherein the semiconductor substrate comprises an interposer with the integrated circuit device mounted thereon.

12. The semiconductor substrate of claim 11, wherein the test terminal is connected to a measurement device, and
   the measurement device is configured to perform an integration of the induced voltage to calculate a current supplied to the integrated circuit device.

13. The semiconductor substrate of claim 10, wherein the plurality of inductive vias comprise at least eight inductive vias, and the at least eight inductive vias are arranged apart from one another in four different directions around said power via.

14. The semiconductor substrate of claim 10, wherein the plurality of inductive vias comprise at least four inductive vias, and at least eight additional inductive vias disposed apart from one another in eight different directions around said power via.

15. The semiconductor substrate of claim 10, wherein said test terminals are electrically connected to one end of each of the plurality of inductive vias and at least one of the plurality of wirings.

16. The semiconductor substrate of claim 15, wherein said test terminals are a do not use (DNU) terminal of a plurality of connection terminals formed in the semiconductor substrate.

17. A test system including a test device and at least one integrated circuit device, the at least one integrated circuit device comprising a first integrated circuit device, wherein the first integrated circuit device comprises:
   a first terminal configured to receive a first voltage from the test device;
   a first via connected to the first terminal and passing through at least one of a plurality of layers;
   a plurality of second vias arranged apart from the first via and passing through at least one of said plurality of layers;
   a plurality of wirings connected to ends of at least some of the plurality of the second vias and configured to form with the plurality of said second vias a coil wound in a toroidal form, around said first via; and
   a second terminal configured to accept a voltage induced in the coil to be output to the test device, in response to the supply of said first voltage to the first via, and
   wherein said test device is connected to the second terminal and is configured to measure a signal supplied to the first integrated circuit device on the basis of the induced voltage.

18. The test system of claim 17, wherein the first voltage comprises a source voltage, and
   the signal comprises a current supplied to the first integrated circuit device.

19. The test system of claim 18, wherein the test device is configured to perform an integration of the induced voltage to calculate a current supplied to the first integrated circuit device.

20. The test system of claim 17, wherein the at least one integrated circuit device comprises a memory die and is mounted on a memory module.

* * * * *